United States Patent [19]
Kim et al.

[11] Patent Number: 5,633,206
[45] Date of Patent: May 27, 1997

[54] PROCESS FOR MANUFACTURING LEAD FRAME FOR SEMICONDUCTOR PACKAGE

[75] Inventors: Sang H. Kim; Sung M. Sim; In P. Hong, all of Suwon; Sang G. Lee, Cheonan, all of Rep. of Korea

[73] Assignee: Samsung Electronics Co., Ltd., Suwon, Rep. of Korea

[21] Appl. No.: 557,540

[22] Filed: Nov. 14, 1995

[30] Foreign Application Priority Data

Jul. 31, 1995 [KR] Rep. of Korea ............... 1995-23471

[51] Int. Cl.$^6$ ........................................ H01L 21/60
[52] U.S. Cl. ........................ 29/827; 427/96; 438/123
[58] Field of Search ........................... 437/209, 211, 437/212, 214, 215, 216, 217, 218, 219, 220

[56] References Cited

U.S. PATENT DOCUMENTS

| | | |
|---|---|---|
| 4,369,090 | 1/1983 | Wilson et al. ........................ 216/83 |
| 4,709,468 | 12/1987 | Wilson . |
| 4,890,157 | 12/1989 | Wilson . |
| 4,916,519 | 4/1990 | Ward ........................ 257/666 |
| 4,965,654 | 10/1990 | Karner et al. ........................ 257/676 |
| 5,070,039 | 12/1991 | Johnson et al. ........................ 437/217 |
| 5,208,188 | 5/1993 | Newman ........................ 437/209 |
| 5,313,102 | 5/1994 | Lim et al. . |
| 5,384,690 | 1/1995 | Davis et al. ........................ 361/789 |
| 5,429,992 | 7/1995 | Abbott et al. ........................ 437/220 |
| 5,434,106 | 7/1995 | Lim et al. ........................ 437/220 |

*Primary Examiner*—Kevin Picardat
*Attorney, Agent, or Firm*—Cushman Darby & Cushman IP Group of Pillsbury Madison & Sutro LLP

[57] ABSTRACT

A process for manufacturing a lead frame having a pad, inner leads, outer leads and dambars, the lead frame being coated with a film on the back surface of the pad, which includes the steps of preparing a lead frame having a pad, inner leads and outer leads; placing a polyamic acid film on the back surface of the pad without using adhesive; and thermally compressing the polyamic acid film by using a heat; generator, to form polyimide film and simultaneously adhere that to the polyimide film the back surface of the pad.

5 Claims, 9 Drawing Sheets

PROCESS FOR MANUFACTURING LEAD FRAME FOR SEMICONDUCTOR PACKAGE

BACKGROUND OF THE INVENTION

1. Field of the Invention

The present invention relates generally to a process for manufacturing a lead frame for a semiconductor package, and, more particularly, to a process for manufacturing a lead frame for a semiconductor package, of which the back surface of the pad thereof is coated with a polyimide film in order to prevent, after an electronic device containing the lead frame is encapsulated by a molding compound, delamination (or separation) of the molding compound from the pad.

2. Description of the Prior Arts

Lead frames, are used for packaging semiconductor devices such as transistors, or integrated circuits, which are mounted onto the pads of respective lead frames, and then encapsulated. A lead frame includes a lead frame pad onto which a semiconductor chip(s) is(are) mounted, leads electrically connected to the chips through wires, and dambars for preventing flowing out of molding resin during encapsulation.

A lead frame may further have a plurality of dimples formed on its "back surface or inactive surface" (the surface opposite to the surface onto which semiconductor chip is mounted) of its lead frame pad to improve the bonding force between the die pad and the molding resin, in order to prevent separation (or delamination) of the resin from the pad after completing packaging, due to difference of thermal expansion coefficient between the resin and the pad. Lead frames formed with dimples have an important role in improving reliability of ultraslim semiconductor packages such as TSOP (Thin Small Outline) or SOJ (Small Outline "J" Bending) Packages.

A lead frame also may be coated with a polymer film, for example a polyimide film on the back surface of the pad, to improve the bonding force between the lead frame pad and the molding resin. The film is bonded to back surface of pad by adhesive, and may have a plurality of dimples, usually formed by a stamping method.

Since ultraslim semiconductor packages such as TSOP or SOJ Packages are very thin, they are fragile. Further, moisture from external environments may penetrate into the package, resulting in separation of the molding resin from the pad.

FIG. 1 is a schematic plan view of a conventional lead frame for a semiconductor package.

FIG. 2A is a bottom palan view of a prior art lead frame pad, of which the back surface is provided with circular dimples; and FIG. 2B is a cross; sectional view along line A—A of FIG. 2A.

FIG. 3A is a bottom view of a prior art lead frame pad, of which the back surface is provided with diamond shaped dimples; and FIG. 3B is a cross; sectional view along line B—B of FIG. 3A.

With now reference to FIGS. 1 through 3B, lead frame (100) comprises a lead frame pad (50) onto which a semiconductor chip (not shown) is mounted by an adhesive (not shown), inner leads (30) of the lead frame being electrically connected to the bonding pad (not shown) formed on the chip, through wires (not shown), outer leads (40), which are integrated with respective ones of the inner leads and are electrically connected to respective external terminals (not shown), dam bars (20) for preventing flowing of the molding resin during encapsulation of the chip, wires and lead frame pad by the resin, side rails (10) formed at the top and bottom ends of the lead frame (100), and index holes (12), which are formed within the side rail (10), for appropriately transferring the lead frame by a transferring means (not shown).

The dimples (155, 255) may be formed on back surface (150) of the lead frame pad by using an etching method, or formed on polyimide film (250) adhered to the back surface of the lead frame pad by using a stamping method. The etching method forms various shaped dimples including round dimples (155), while the stamping method forms mainly diamond shaped (or chamfered) dimples (255).

The etching method has the advantages that it can form round dimples, which provides highly reliable packages, and that it can be applied to manufacture of TSOP or SOJ Packages, which requires high reliability. Further, it may forms various shapes of dimples, including round dimples.

However, it has the drawbacks that, since it requires etching of the lead frame pad itself, the production cost is high, while productivity is low.

By contrast, the stamping method is advantageous over the etching method in that the productivity is high and the production cost is low. However, it cannot form round dimples. Further, diamond shaped dimples, which are formed by the stamping method, show no effect in improving the bonding force between the pad and the resin, in case of ultra-slim packages such as TSOP or SOJ Packages.

FIG. 4A is a bottom plan view of a conventional lead frame, of which the pad is coated with polyimide film on its back surface; and FIG. 4B is a cross; sectional view along line C—C of FIG. 4A.

With now reference with FIG. 4, lead frame pad (350) is coated with a layer of polyimide film (310) on its back surface, the film being held in place by a layer of adhesive (320). In this prior art construction, the adhesive layer (320) serves as a path for the penetration of moisture from the external environment, resulting in a peeling off (or delamination) of the molding resin (310) from the pad (350).

Accordingly, there has been a need to provide lead frames without disadvantages which have been described above.

SUMMARY OF THE INVENTION

Accordingly, an object of the present invention is to provide a lead frame for a semiconductor package which is not subject to the problem of delamination between the lead frame pad and the molding resin.

To accomplish the above object, the present invention provides a process for a manufacturing lead frame having a pad, inner leads, outer leads and dambars, this lead frame having a film attached on back surface of the pad, which comprises the steps of:

preparing a lead frame comprising a pad, inner leads and outer leads;

placing a polyamic acid film on the back surface of the pad, without using adhesive; and thermally compressing the film by using a heat generator, to form polyimide film and at the same time to adhere the film to back surface of the pad.

The present invention also provides a process for manufacturing a semiconductor package.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

The present invention will now be described in more detail with reference to accompanying drawings.

Figure 5A:
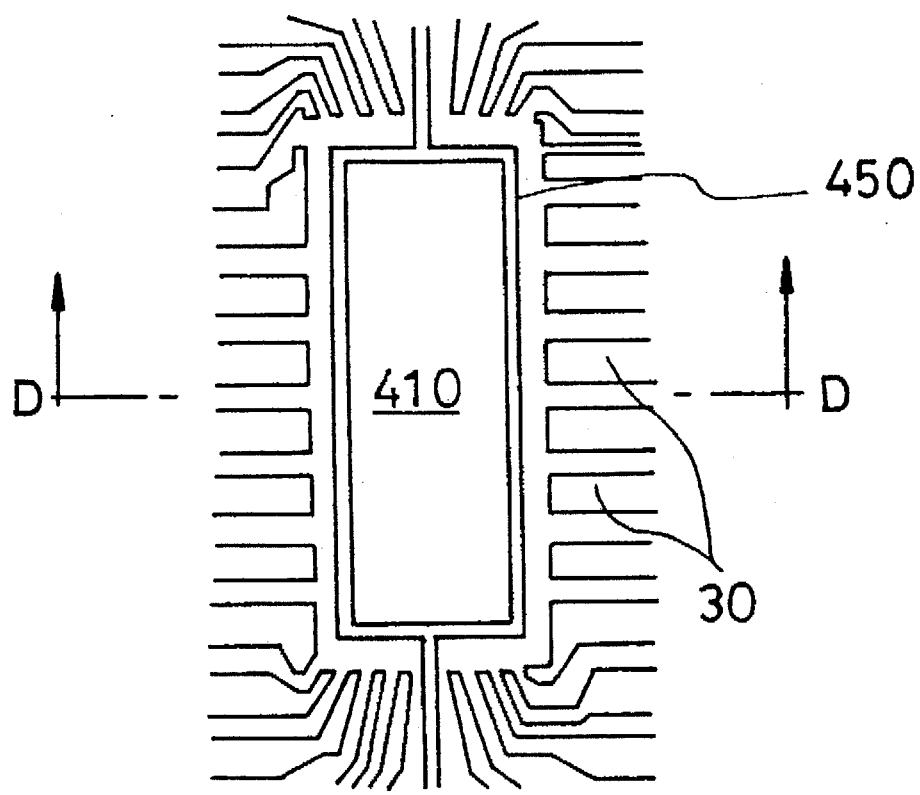
FIG. 5A is a bottom plan view of a lead frame according to the present invention, of which the pad is coated with a layer of polyimide film on its back surface.
Figure 5B:
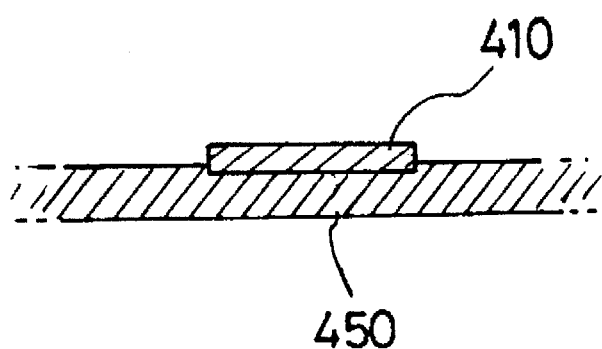
FIG. 5B is a cross; sectional view along line D—D of FIG. 5A.

FIG. 5A is a bottom plan view of lead frame according to the present invention, of which the pad has a layer of polyimide film attached on its back surface; and FIG. 5B is a cross; sectional view along line D—D of FIG. 5A.

Figure 6A:
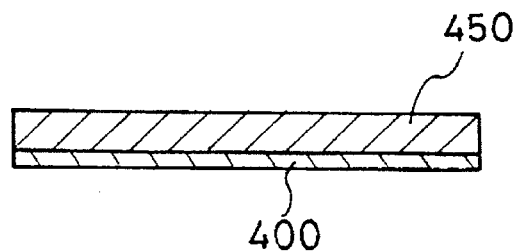
FIGS. 6A through 6C show the steps of manufacturing a lead frame according to the present invention.
Figure 6B:
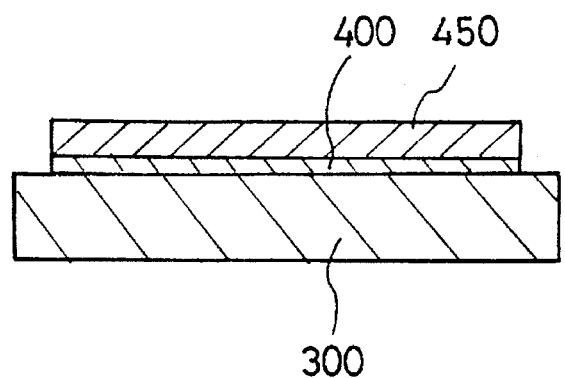
Figure 6C:
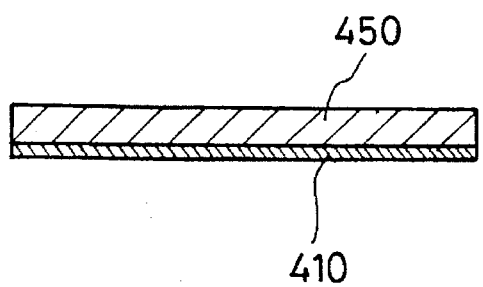

FIGS. 6A through 6C show the steps of manufacturing a lead frame according to the process of the present invention. FIGS. 6A through 6C show only the lead frame pad.

Figure 1:
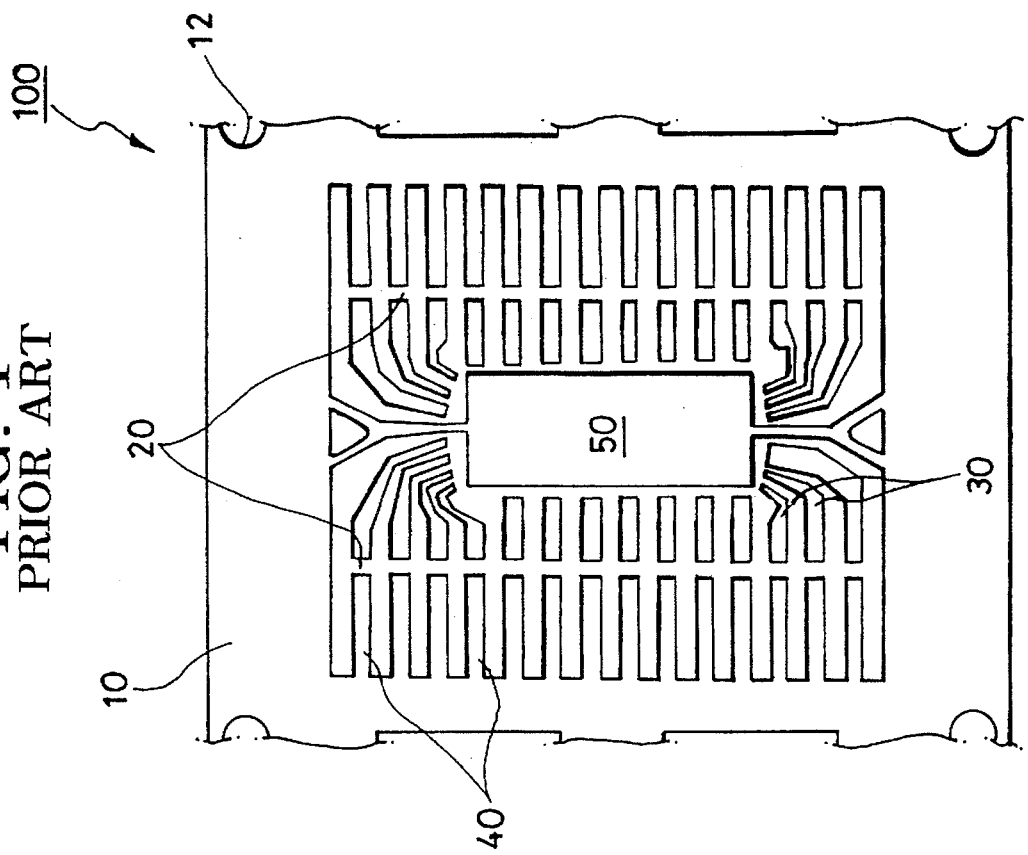
FIG. 1 is a schematic plan view of a lead frame.
Figure 2A:
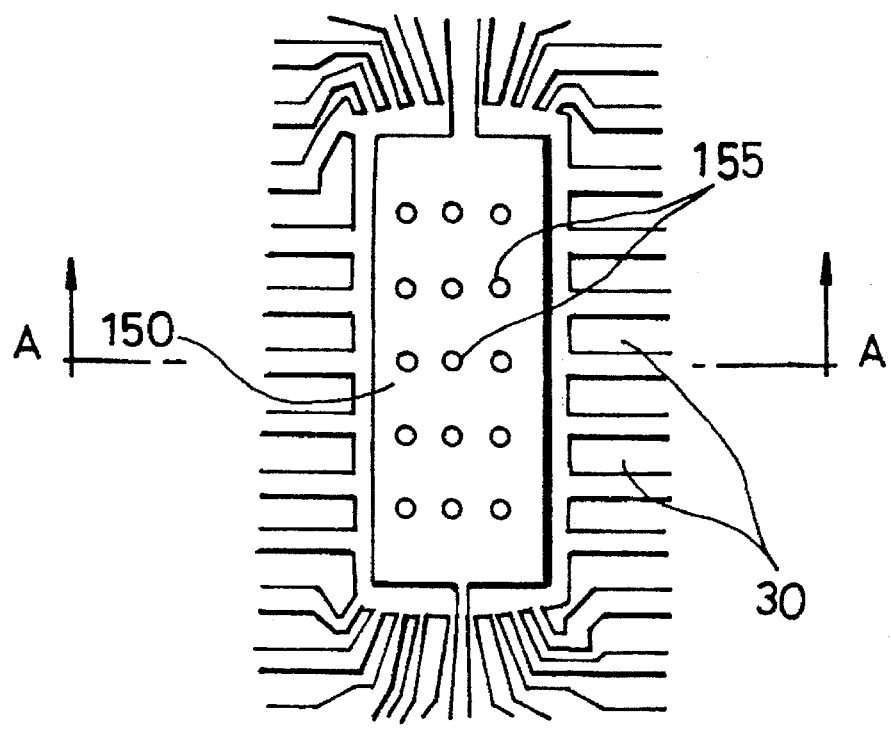
FIG. 2A is a bottom view of a lead frame pad, of the back surface is provided with round dimples.
Figure 2B:
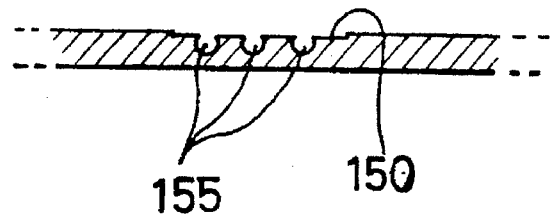
FIG. 2B is a cross sectional view along line A—A of FIG. 2A.
Figure 3A:
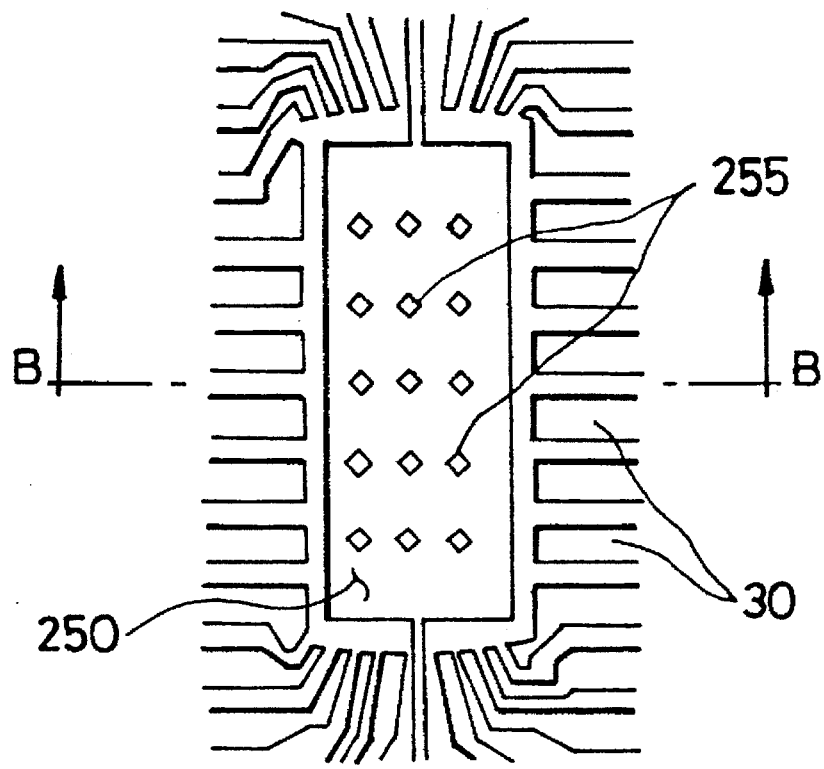
FIG. 3A is a bottom plan view of a lead frame pad, of which the back surface is provided with diamond shaped dimples.
Figure 3B:
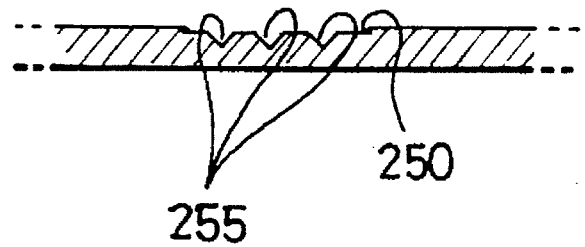
FIG. 3B is a cross; sectional view along with line B—B of FIG. 3A.
Figure 4A:
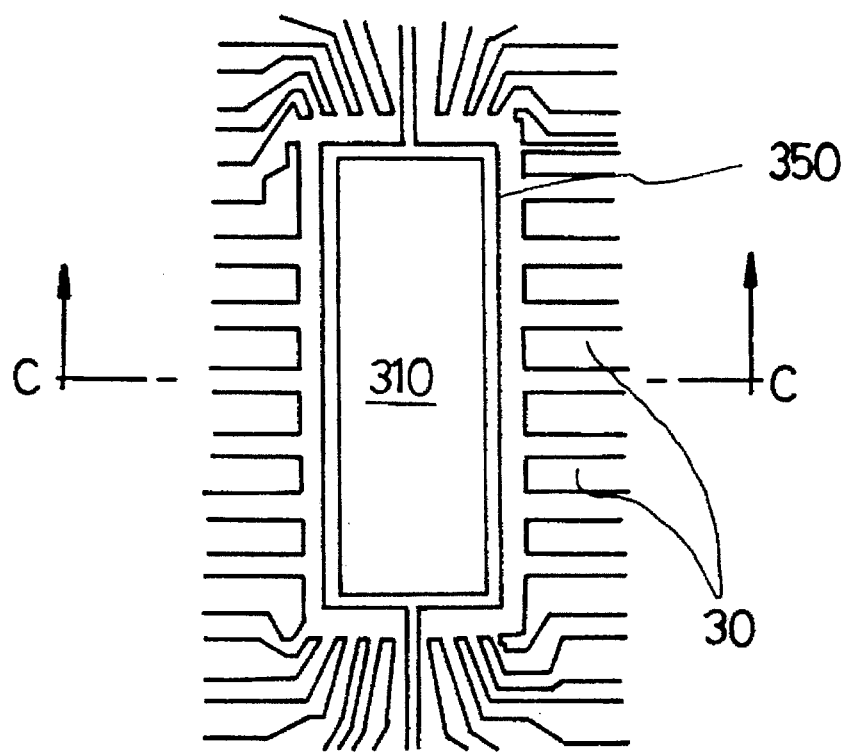
FIG. 4A is a bottom plan view of a conventional lead frame, of which the pad is coated with a layer of polyimide film on its back surface.
Figure 4B:
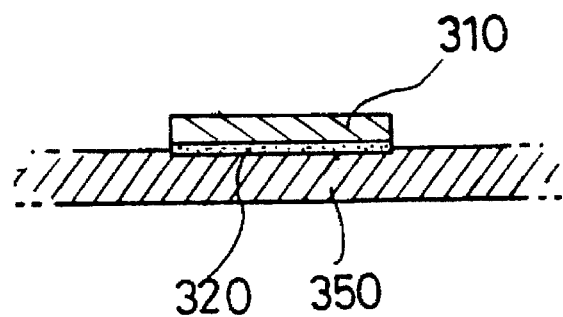
FIG. 4B is a cross; sectional view along line C—C of FIG. 4A.

With now reference with FIGS. 5 and 6, lead frame pad (450) has a layer of polyimide film (410) directly attached on its back surface, without using adhesive. Other features and structure are the same as those of lead frame (100) shown in FIG. 1.

The manufacturing process according to the present invention will be described in more detail hereinafter.

The process comprises the following steps:
(1) Preparation of a lead frame (not completely shown) comprising a pad, inner leads and outer leads.
(2) Direct adherence of a film (400) to the back surface of the pad (450), without using adhesive.
(3) Thermal compression of the film (400) by using a heat; generator (300) placed below the pad (450).
(4) Formation of polyimide film (410) from the film (400) in situ by thermal compression of the latter.

For the present invention, the direct attachment of polyimide film without using adhesive can be accomplished by use of polyamic acid film as the film (400). The polyamic acid film placed on back surface of the pad is polymerized into a highly adhesive polyimide film, in situ, by thermal compression.

The thermal compression may be effected by using a heat; generator at about 350°–420° C.

The thus manufactured lead frame is used for packaging of a semiconductor chip. Thus, the chip is mounted on the lead frame pad, electrically connected to inner leads by using a wire; bonding process, and then encapsulated by a molding resin. The resulting semiconductor package having a lead frame according to the present invention does not undergo delamination between the molding resin and lead frame pad.

Further, the polyimide film has a role of buffering stress generated during molding process.

The film (400) may have various shapes, as long as its size is not larger than that of the lead frame pad.

Figure 9:
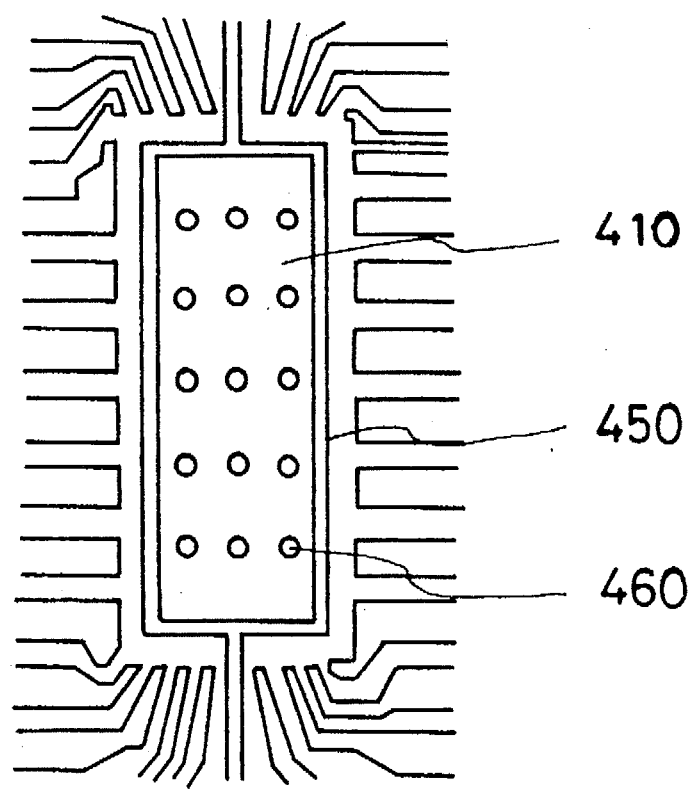
FIG. 9 is a schematic plan view of a lead frame pad, the back surface of which has a layer of polyimide provided thereon, and which layer is formed with through holes.

Moreover, as shown in FIG. 9, the film (400) may have at least one through hole (460), which would play the same role as that of round dimples formed on lead frame pad by an etching method or by punching.

Of course, variously shaped dimples may be formed on the polyimide film (400) by a stamping or etching method. Alternatively, the lead frame pad itself may be provided with a plurality of dimples.

Experimental Example 1

Figure 7:
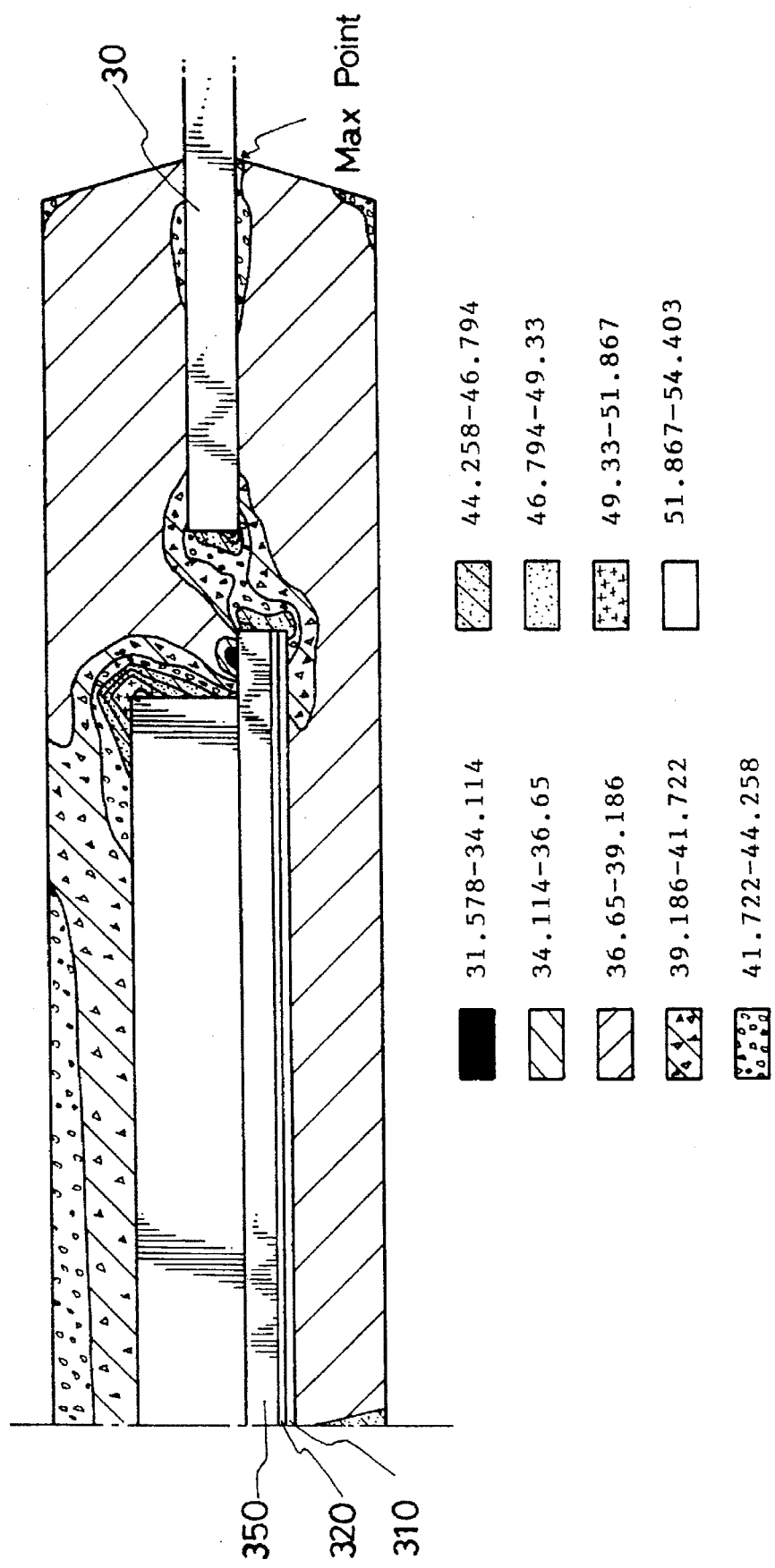
FIG. 7 is a schematic diagram showing the level of stress on a package, of which the lead frame pad has a polyimide film attached thereto using adhesive on the back surface of the lead frame pad.

To evaluate the level of stress on a semiconductor package, two plastic packages, each having a lead frame pad having a layer of polyimide film attached of the back surface thereof were prepared. One had a structure in which the layer of polyimide film (310) was attached to the back surface of the lead frame pad (350) by use of a layer of adhesive (320), as shown in FIG. 7. The other had a structure according to polyimide film (410) which a layer of was attached to the back surface of the lead frame pad (450) according to the method of the present invention, without using adhesive, as shown in FIG. 8.

Figure 8:
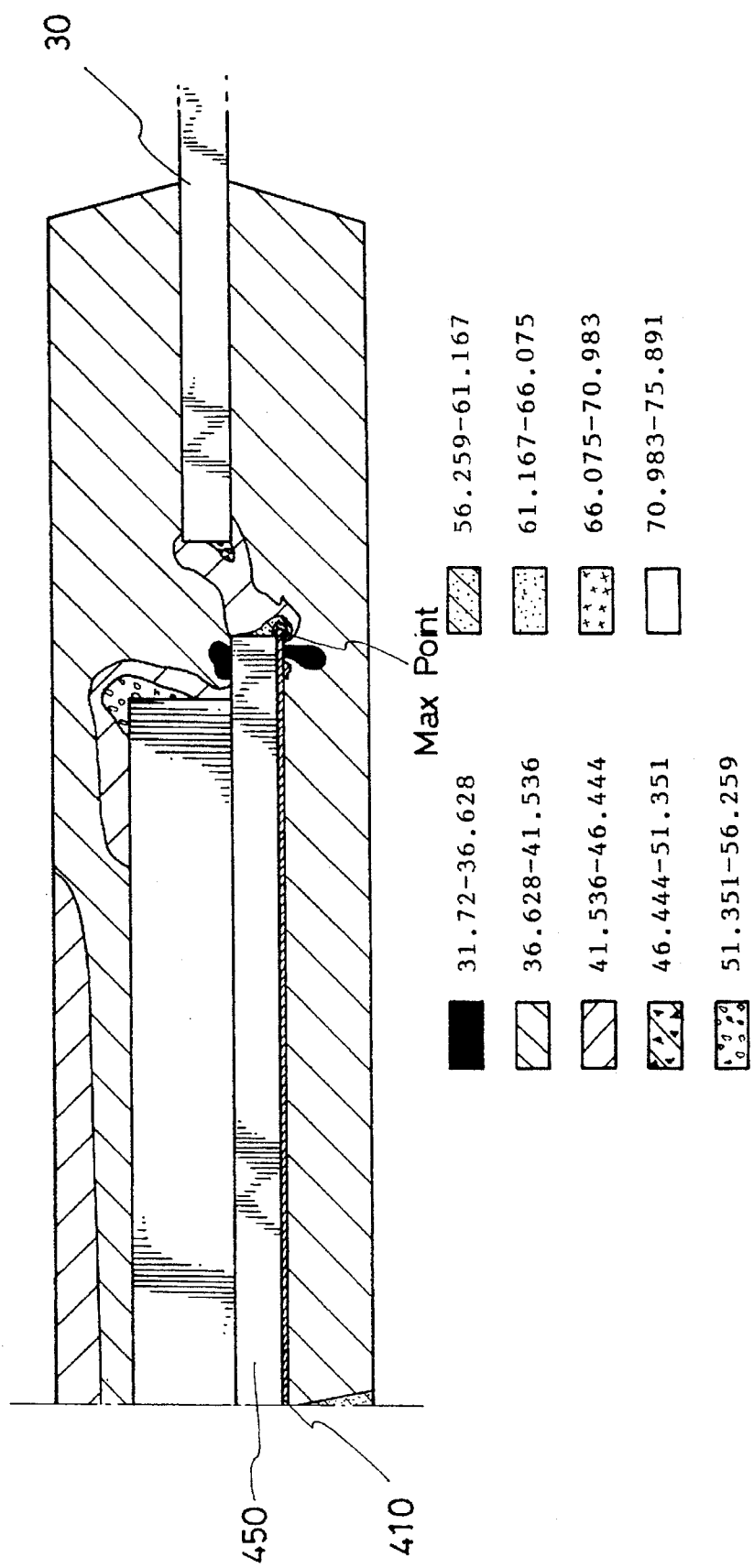
FIG. 8 is a schematic diagram showing the level of stress on a package, of which the lead frame pad has a polyimide film attached thereto according to the present invention.

These two packages were measured for their stress level, and the results are shown in FIGS. 7 and 8, respectively.

FIGS. 7 and 8 show schematically the stress level throughout the respective package. In FIGS. 7 and 8, the features indicate the stress levels in terms of MPa. As can be seen therefrom, for the package in which the polyimide film is attached to the back surface of lead frame pad by use of thermocompression technology without using adhesive (FIG. 8), the maximum stress is localized at an edge of the pad, while, for the package in which the polyimide film is attached to the back surface of the lead frame pad by use of adhesive (FIG. 7), the stress is rather distributed over the chip and inner lead, and maximum stress appears at the end interface between the inner lead and the molding compound. For the later case, package cracking or moisture penetration easily occurs, compared to the former case.

Further, the package shown in FIG. 8 did not undergo a delamination of molding compound from the pad due to moisture penetration after storage at a temperature of about 40° C., and at 70% relative humidity for 10 days.

Although a preferred embodiment of the present invention has been described in detail hereinabove, it should be clearly understood that many variations and/or modifications of the basic inventive concepts herein taught, which may appear to those skilled in the art, will still fall within the spirit and scope of the present invention as defined in the appended claims.

What is claimed is:

1. A process for manufacturing lead frame, which comprises the steps of:

providing a lead frame comprising a pad having a back surface, inner leads, outer leads and dambars;

placing a layer of polyamic acid film on said back surface of said pad so that the polyamic acid film adheres to the back surface of the pad without using any other adhesive; and thermally compressing said film by using a heat-generator to form polyimide film from said polyamic acid film and at the same time to cause the polyimide film to adhere to said back surface of said pad.

2. The process of claim 1, wherein the thermal compression of polyamic acid film is carried out at temperature of 350°–420° C.

3. A process for manufacturing a semiconductor chip package, which comprises the steps of:

providing a lead frame comprising a pad having a back surface, inner leads, and outer leads;

placing a layer of polyamic acid film on said back surface of said pad so that the polyamic acid film adheres to the back surface of the pad without using any other adhesive;

thermally compressing said polyamic acid film by using a heat-generator to form polyimide film from said polyamic acid film and simultaneously cause it to adhere to said back surface of said pad;

mounting a semiconductor chip on the pad;

electrically connecting the chip to the inner leads through wires; and encapsulating the chip and the lead frame by a molding resin.

4. The process of claim 3, wherein the thermal compression of polyamic acid film is carried out at temperature of 350°–420° C.

5. The process of claim 3, wherein the polyamic acid film has at least one through hole.

* * * * *